United States Patent
Blank

(10) Patent No.: US 10,910,318 B2
(45) Date of Patent: Feb. 2, 2021

(54) OPTICALLY DETECTABLE REFERENCE FEATURE FOR DIE SEPARATION

(71) Applicant: Infineon Technologies Austria AG, Villach (AT)

(72) Inventor: Oliver Blank, Villach (AT)

(73) Assignee: Infineon Technologies Austria AG, Villach (AT)

( * ) Notice: Subject to any disclaimer, the term of this patent is extended or adjusted under 35 U.S.C. 154(b) by 52 days.

(21) Appl. No.: 16/279,339

(22) Filed: Feb. 19, 2019

(65) Prior Publication Data

US 2019/0259709 A1 Aug. 22, 2019

(30) Foreign Application Priority Data

Feb. 20, 2018 (DE) .................... 10 2018 103 738

(51) Int. Cl.
- *H01L 23/544* (2006.01)
- *H01L 21/66* (2006.01)
- *H01L 21/78* (2006.01)

(52) U.S. Cl.
CPC ............ *H01L 23/544* (2013.01); *H01L 21/78* (2013.01); *H01L 22/20* (2013.01); *H01L 2223/5446* (2013.01); *H01L 2223/54426* (2013.01)

(58) Field of Classification Search
CPC .................. H01L 23/544; H01L 21/78; H01L 2223/5448
See application file for complete search history.

(56) References Cited

U.S. PATENT DOCUMENTS

| | | | |
|---|---|---|---|
| 9,679,855 B1 | 6/2017 | Lee et al. | |
| 2006/0019424 A1* | 1/2006 | Weng | H01L 27/14685 438/60 |
| 2011/0304024 A1* | 12/2011 | Renna | H01L 31/02019 257/620 |

* cited by examiner

Primary Examiner — Quoc D Hoang
(74) Attorney, Agent, or Firm — Murphy, Bilak & Homiller, PLLC

(57) ABSTRACT

A semiconductor wafer has a semiconductor body, an insulation layer on the semiconductor body, an active region with a power semiconductor die, the active region forming a part of the semiconductor body, a scribeline region arranged adjacent to the active region, and a passivation structure arranged above the insulation layer and exposing a section of the insulation layer. The exposed section of the insulation layer is terminated by a termination edge of the passivation structure. The semiconductor wafer also has an optically detectable reference feature configured to serve as a reference position during a wafer separation processing stage. The optically detectable reference feature is included in the active region, spatially displaced from the termination edge, and exposed by the passivation structure.

21 Claims, 12 Drawing Sheets

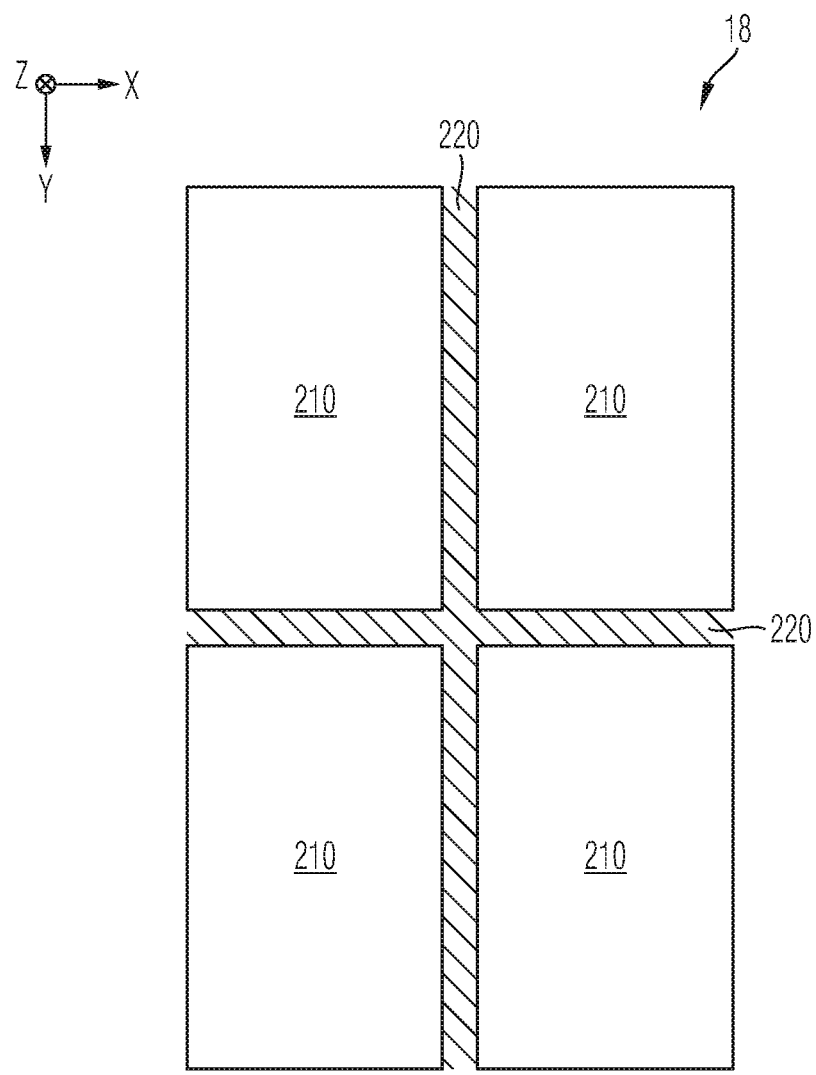

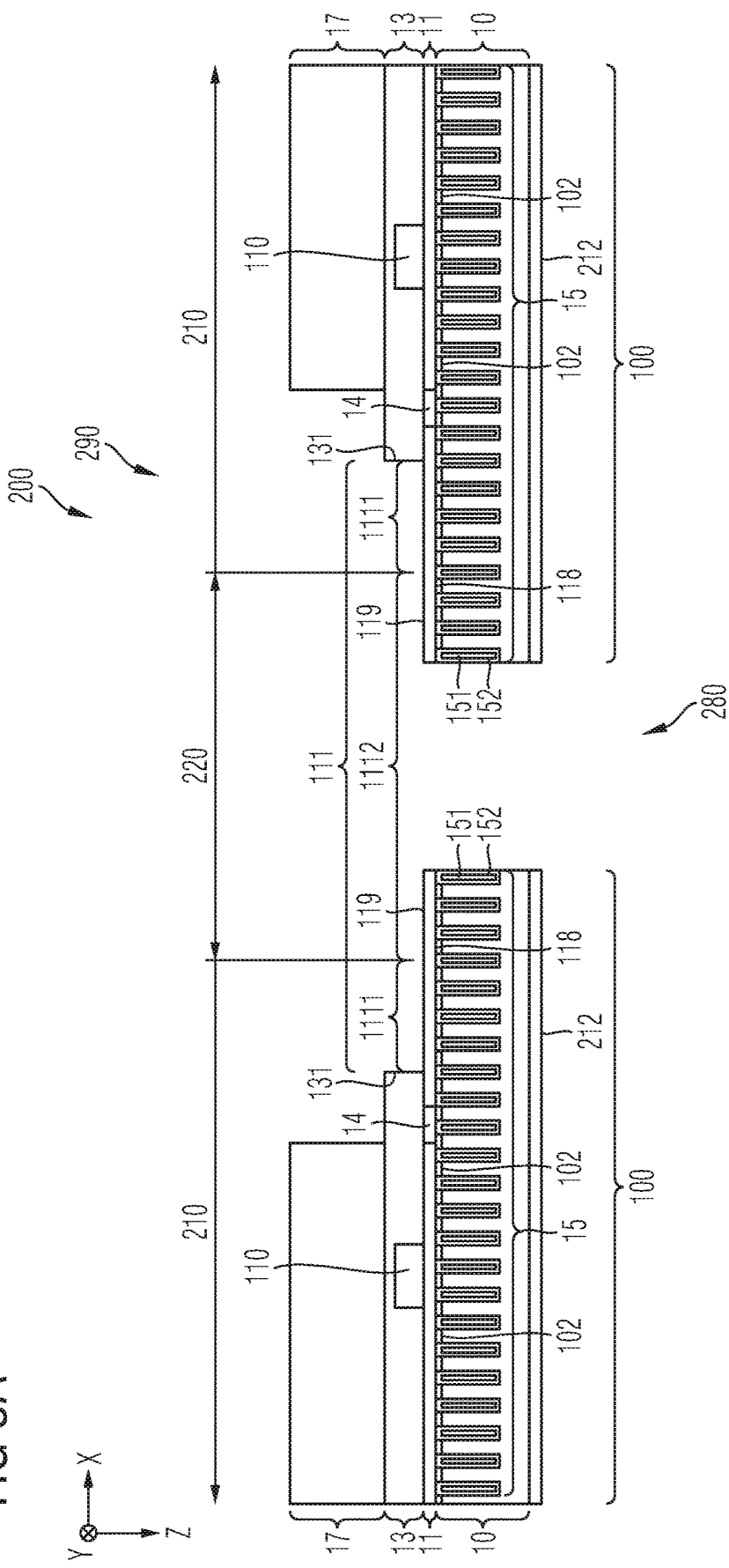

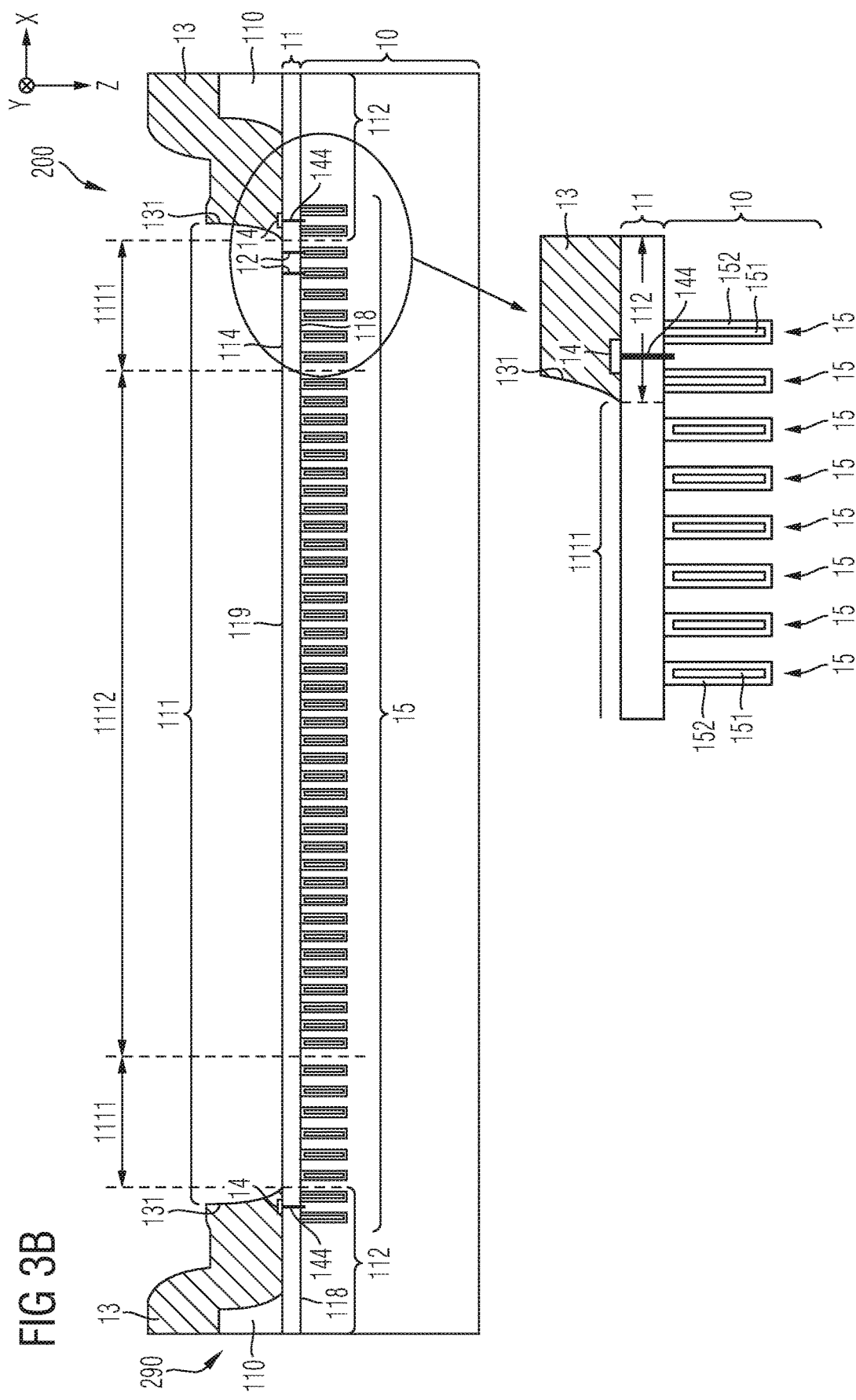

OPTICALLY DETECTABLE REFERENCE FEATURE FOR DIE SEPARATION

TECHNICAL FIELD

This specification refers to embodiments of a semiconductor wafer, to embodiments of a power semiconductor die, to embodiments of a method of processing a semiconductor wafer, and to embodiments of a semiconductor wafer separation apparatus. In particular, this specification relates to embodiments of a semiconductor wafer that comprises one or more optically detectable reference features for die separation, to embodiments of a power semiconductor die that comprises at least one optically detectable reference feature for die separation, to embodiments of a method of processing a semiconductor wafer that comprises one or more optically detectable reference features for die separation, and to embodiments of a semiconductor wafer separation apparatus configured to separate a semiconductor wafer comprising one or more optically detectable reference features into a plurality of power semiconductor dies.

BACKGROUND

Many functions of modern devices in automotive, consumer and industrial applications, such as converting electrical energy and driving an electric motor or an electric machine, rely on power semiconductor devices.

For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a power semiconductor die configured to conduct a load current along a load current path between two load terminals of the die. Further, the load current path may be controlled by means of an insulated electrode, sometimes referred to as gate electrode. For example, upon receiving a corresponding control signal from, e.g., a driver unit, the control electrode may set the power semiconductor device in one of a conducting state and a blocking state.

Regarding the manufacturing process, a plurality of power semiconductor dies are usually simultaneously processed within a single wafer; i.e., after having been processed, the semiconductor wafer may include a plurality of power semiconductor dies. These power semiconductor dies may be separated from each other by means of scribelines.

The wafer is then subjected to a separation processing stage, e.g., including a dicing and/or sawing step, and the wafer is divided into the plurality of separate power semiconductor dies by breaking (e.g., by sawing and/or dicing) the wafer at the scribelines. After a quality check, the dies may then be enclosed in a respective package and thereafter be delivered to the customer.

Said quality check may include checking, if the die has been damaged during the separation processing step. For example, during the separation, an insulation layer that was exposed to the separation may become damaged and/or a crack may extend into the edge termination region of one of the dies. For example, if considered to be damaged or, respectively, if it cannot reliably ensured that the die has not been damaged, the die is not packaged but discarded.

Naturally, the portion of the wafer that is used for the scribelines cannot be used as die area. Hence, it is desirable to design the scribelines as small as possible. But, the requirements regarding accuracy of the separation processing stage increase as the scribeline decreases in dimension.

SUMMARY

Certain aspects of the present specification are related to an optically detectable reference feature that serves as a landmark for carrying out the wafer separation processing stage. For example, the separation processing stage includes the step of acquiring position data indicative of the position of the optically detectable reference feature and controlling a relative movement between the wafer and a wafer separation device (e.g., a laser dicing device or a sawing device) based on the position data. For example, the optically detectable reference feature is spatially displaced from the scribelines.

According to an embodiment, a semiconductor wafer has: a semiconductor body; an insulation layer on the semiconductor body; an active region with a power semiconductor die, the active region forming a part of the semiconductor body; a scribeline region arranged adjacent to the active region; a passivation structure arranged above the insulation layer and so as to expose a section of the insulation layer, the exposed section being terminated by a termination edge of the passivation structure; an optically detectable reference feature configured to serve as a reference position during a wafer separation processing stage. The optically detectable reference feature is: (i) included in the active region, (ii) spatially displaced from the termination edge, and (iii) exposed by the passivation structure.

According to another embodiment, a method of processing a semiconductor wafer comprises providing a semiconductor wafer, the semiconductor wafer comprising: a semiconductor body; an insulation layer on the semiconductor body; an active region with a power semiconductor die, the active region forming a part of the semiconductor body; a scribeline region arranged adjacent to the active region; a passivation structure arranged above the insulation layer and so as to expose a section of the insulation layer, the exposed section being terminated by a termination edge of the passivation structure. The method further comprises: providing an optically detectable reference feature configured to serve as a reference position during a wafer separation processing stage. The optically detectable reference feature is: (i) included in the active region, (ii) spatially displaced from the termination edge, and (iii) exposed by the passivation structure.

According to another embodiment, a power semiconductor die has: a semiconductor body; an insulation layer on the semiconductor body; an active region, the active region forming a part of the semiconductor body; a remaining portion of a semiconductor wafer scribeline region arranged adjacent to the active region; a passivation structure arranged above the insulation layer and so as to expose a section of the insulation layer, the exposed section being terminated by a termination edge of the passivation structure; an optically detectable reference feature configured to serve as a reference position during a wafer separation processing stage. The optically detectable reference feature is: (i) included in the active region, (ii) spatially displaced from the termination edge, and (iii) exposed by the passivation structure.

According to a further embodiment, a method of processing a semiconductor wafer comprises providing the semiconductor wafer, wherein the semiconductor wafer has: a semiconductor body; an insulation layer on the semiconductor body; an active region with a power semiconductor die, the active region forming a part of the semiconductor body; a scribeline region arranged adjacent to the active region; a passivation structure arranged above the insulation layer and so as to expose a section of the insulation layer, the exposed section being terminated by a termination edge of the passivation structure; an optically detectable reference feature configured to serve as a reference position during a wafer separation processing stage. The optically detectable reference feature is: (i) included in the active region, (ii) spatially displaced from the termination edge, and (iii) exposed by the passivation structure. The method further comprises: acquiring position data indicative of a position of the optically detectable reference feature; and controlling a relative movement between the semiconductor wafer and a wafer separation device based on the position data.

According to a yet further embodiment, a semiconductor wafer separation apparatus for separating a semiconductor wafer into a plurality of power semiconductor dies is presented. The apparatus comprises a receiver device configured to receive the semiconductor wafer. The semiconductor wafer has: a semiconductor body; an insulation layer on the semiconductor body; an active region with a power semiconductor die, the active region forming a part of the semiconductor body; a scribeline region arranged adjacent to the active region; a passivation structure arranged above the insulation layer and so as to expose a section of the insulation layer, the exposed section being terminated by a termination edge of the passivation structure; an optically detectable reference feature configured to serve as a reference position during a wafer separation processing stage. The optically detectable reference feature is: (i) included in the active region, (ii) spatially displaced from the termination edge, and (iii) exposed by the passivation structure. The apparatus further comprises: a detector configured to acquire position data indicative of a position of the optically detectable reference feature; a computing device configured to receive the position data and course data, the course data being associated with the semiconductor wafer and defining a course of the at least one scribeline region with respect to the position of the at least one optically detectable reference feature; and a wafer separation device coupled to the computing device and configured to separate the semiconductor wafer into the plurality of power semiconductor dies, wherein the computing device is configured to control the wafer separation device based on the position data and the course data.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals may designate corresponding parts. In the drawings:

FIGS. 1A-1C each schematically and exemplarily illustrate a section of a horizontal projection of a semiconductor wafer;

FIG. 3A-3C each schematically and exemplarily illustrates a section of a vertical cross-section of a semiconductor wafer;

DETAILED DESCRIPTION

Figure 1A:
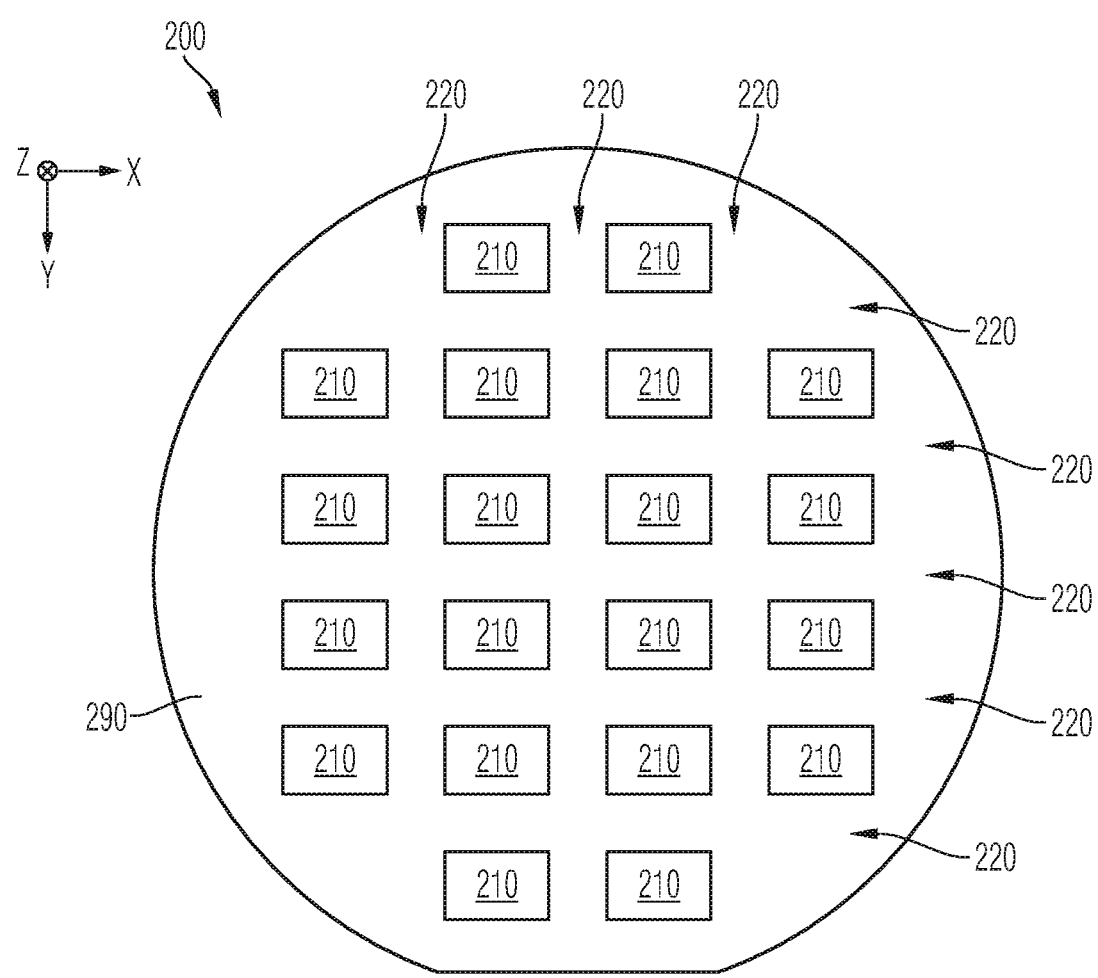

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the (first) lateral direction X and the (second) lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the vertical direction Z mentioned below may be an extension direction that is perpendicular to both the first lateral direction X and the second lateral direction Y.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of the device described herein. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor die, e.g., a power semiconductor die that may be used within a power converter or a power supply. Thus, in an embodiment, such die can be configured to carry a load current that is to be fed to a load and/or, respectively, that is provided by a power source. For example, the die may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. A plurality of such diode cells and/or such transistor cells may be integrated in the die.

The term "power semiconductor die" as used in this specification may describe a single die, e.g., with high voltage blocking and/or high current-carrying capabilities. In other words, such power semiconductor die is intended for high current, typically in the Ampere range, e.g., up to 5 or 100 Amperes, and/or voltages typically above 15 V, more typically up to 40 V, and above, e.g., up to at least 500 V or more than 500 V, e.g. at least 600 V or at least a few kV, e.g., in case of a high power IGBT.

For example, the power semiconductor die described below may be a die that is configured to be employed as a power component in a low-, medium- and/or high voltage application.

Figure 1C:
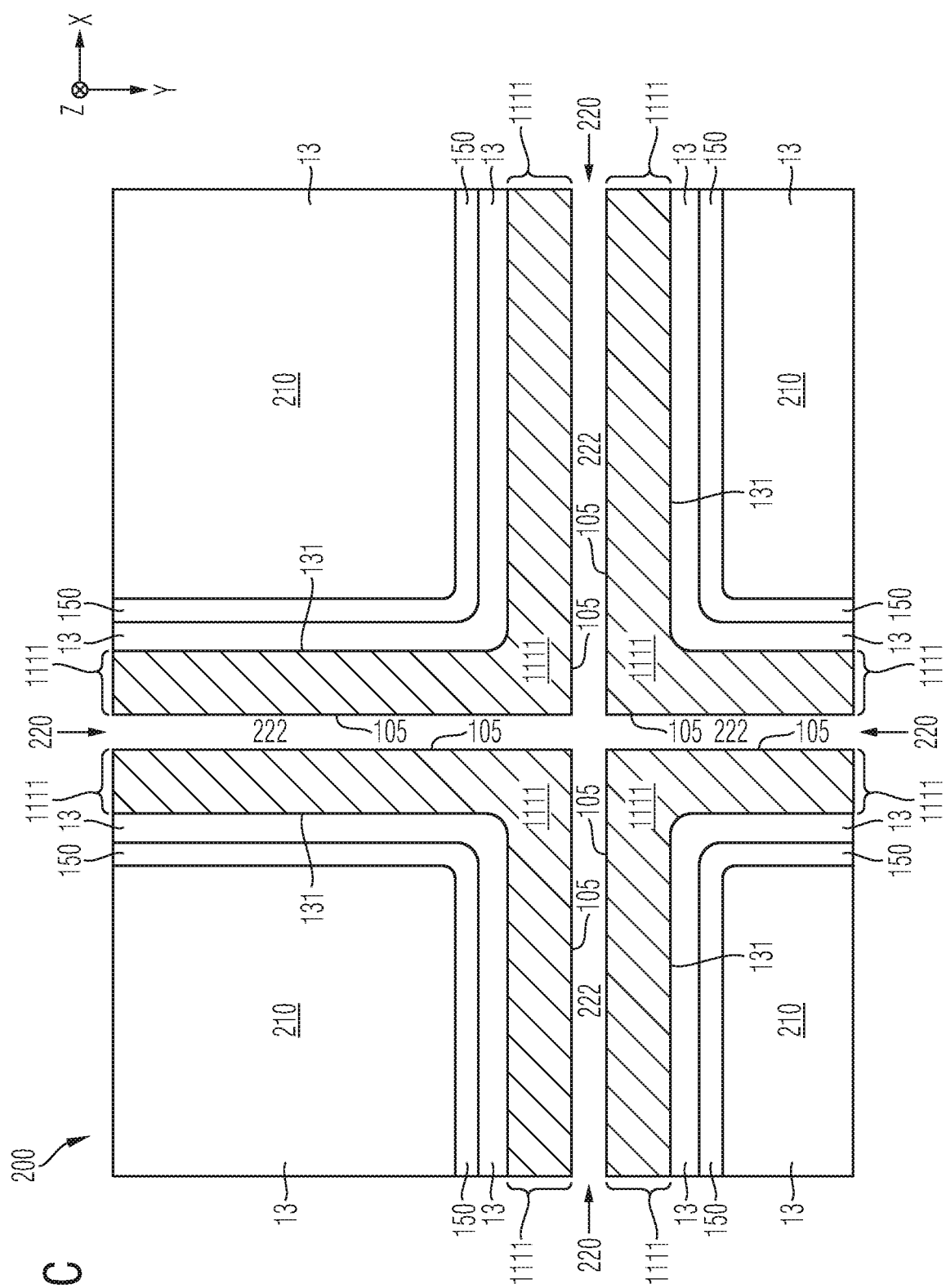
Figure 2A:
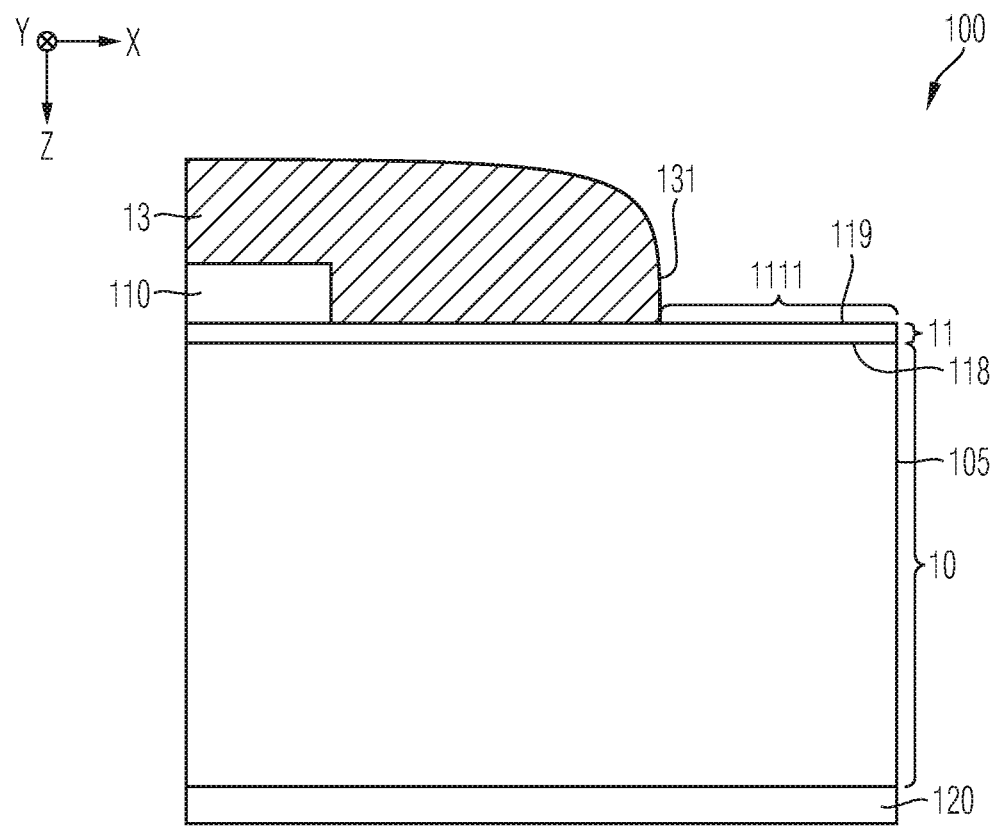
FIG. 2A schematically and exemplarily illustrates a section of a vertical cross-section of a power semiconductor die.
Figure 2B:
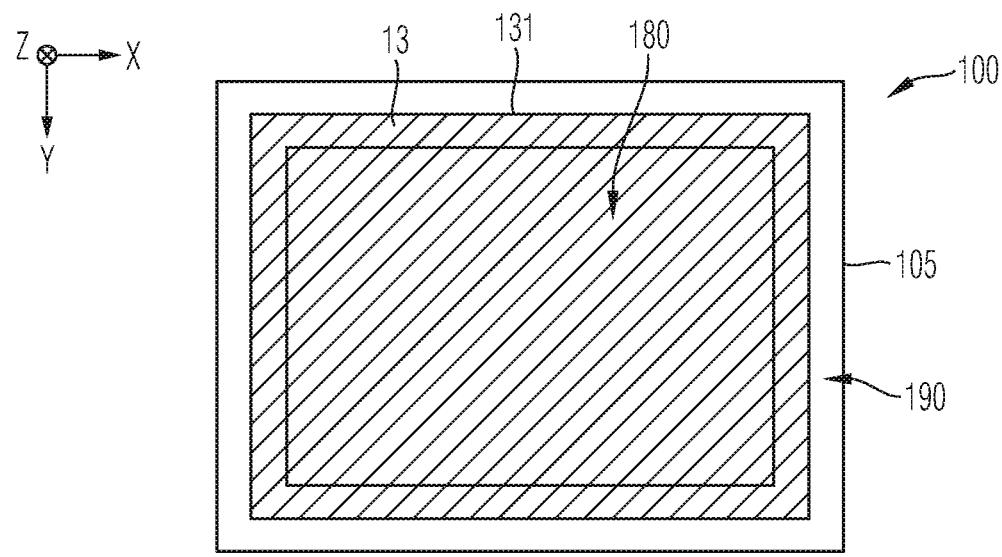
FIG. 2B schematically and exemplarily illustrates a section of a horizontal projection of a power semiconductor die.
Figure 3C:
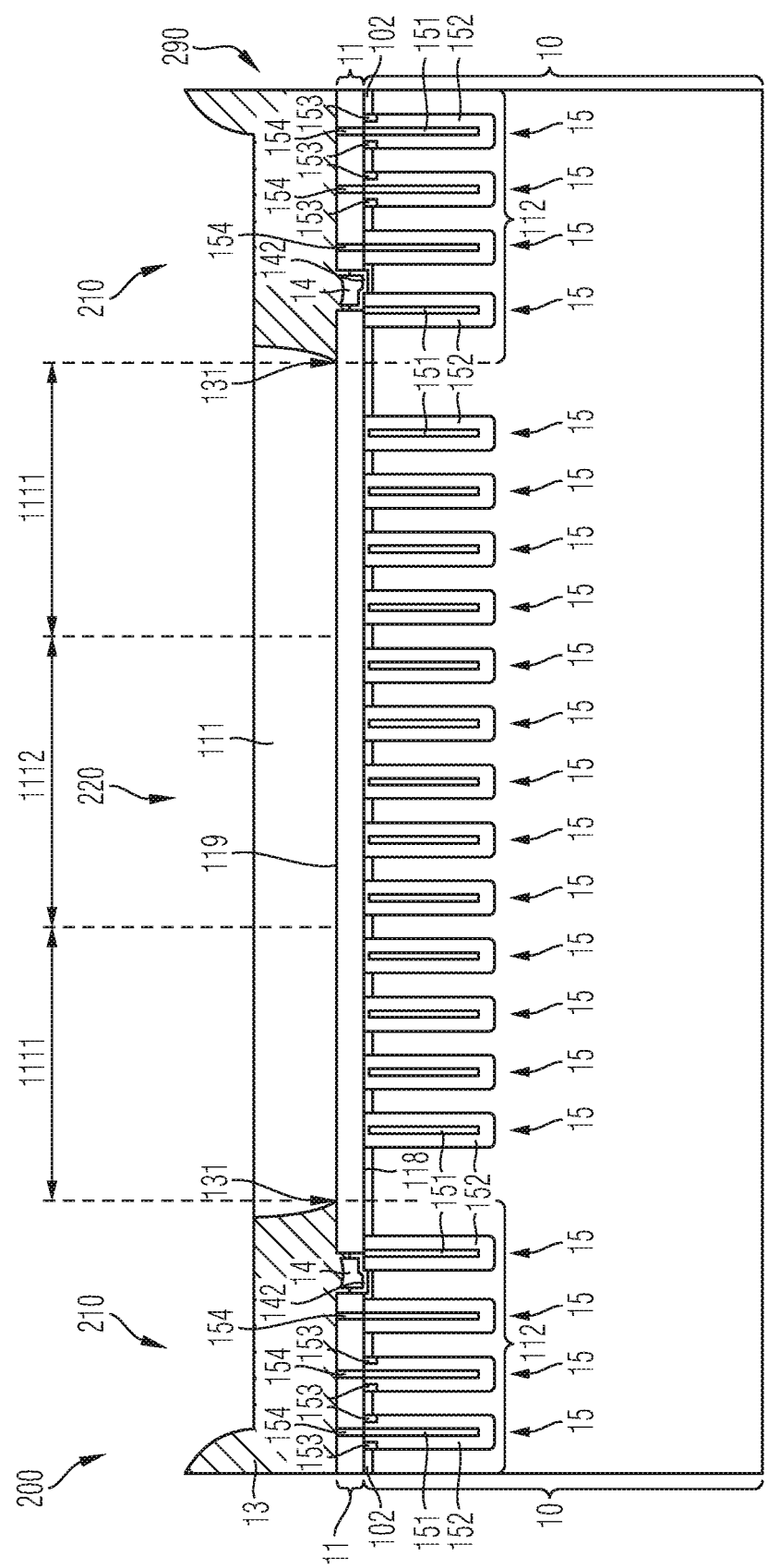

FIGS. 1A-C each schematically and exemplarily illustrate a section of a horizontal projection of a semiconductor wafer 200, FIGS. 2A-B illustrate a vertical cross-section and a horizontal projection of a power semiconductor die 100, and FIGS. 3A-C each schematically and exemplarily illustrate a section of a horizontal projection of the semiconductor wafer 200.

In the following, it will be referred to all of the aforementioned Figures. Whereas none of the aforementioned Figures is explicitly described as illustrating an embodiment, it shall be understood that the embodiments described with respect to the remaining drawings (FIGS. 4-9) may include one or more or all of the features described in the following with respect to FIGS. 1A-3C.

The semiconductor wafer 200 has a semiconductor body 10 (as can be best seen in FIGS. 3A-C). For example, the semiconductor body 10 is based on silicon (Si). In another example, the semiconductor body 10 is based on a different material, e.g. silicon carbide (SiC), gallium nitride (GaN), gallium arsenide (GaAs) or another wide bandgap material.

A thickness of the semiconductor body 10 along the vertical direction Z may be within the range of 5 µm to 300 µm. In an example, the semiconductor body thickness 10 is below a maximum value, e.g., so as to allow for separation by means of laser dicing, e.g., below 100 µm or below 80 µm. A diameter of the semiconductor wafer (in the following also simply referred to as "wafer"), e.g., along the first lateral direction X, may be within range of 4 to 16 inches, e.g., up to 12 inches, in accordance with an example.

Returning to FIGS. 1A-C, the wafer 200 may include one or more active regions 210, and one or more scribeline regions 220 arranged adjacent to the active regions 210, e.g. laterally (horizontally) adjacent to the active regions 210. The active regions 210 and the scribeline regions 220 may exhibit a common vertical extension range corresponding to the thickness of the semiconductor body 10.

Both the scribeline regions 220 and the active regions 210 form a part of the semiconductor body 10. In other words, the semiconductor body 10 may form the main portions of both the scribeline regions 220 and the active regions 210.

For example, each active region 210 has at least one power semiconductor die 100 (as schematically and exemplarily illustrates in FIGS. 2A-B). For example, each active region 210 integrates the at least one power semiconductor die 100. Each power semiconductor die 100 may comprise one or more of the following: a diode, a transistor, a MOSFET, an IGBT, an RC-IGBT, a sensor, a CMOS, an IC (integrated circuit). Such configurations are generally known to the skilled person and are hence herein not described in greater detail.

For example, processing of the semiconductor wafer 200 occurs mainly at a wafer front side 290; e.g., the wafer front side 290 can be subjected to a plurality of processing steps including, for example, one or more implantation processing steps, one or more epitaxy processing steps, one or more deposition processing steps, one or more lithographic processing steps, one or more etching processing steps and the like. For example, at the wafer back side 280 (cf. FIG. 3A), a homogeneously formed (i.e. unstructured) back side metallization layer 212 is provided. For example, this metallization layer 212 forms a part of a load terminal of each power semiconductor die 100, e.g., a drain terminal, a collector terminal or a cathode terminal.

Processing the wafer front side 290 may comprise creating an insulation layer 11 on the semiconductor body 10, as illustrated in each of FIGS. 2A-3C. For example, the insulation layer 11 comprises an intermediate oxidation layer (German: "Zwischenoxidschicht" or "ZWOX"). Further, the insulation layer 11 can comprise an oxide. For example, the insulation layer 11 comprises silicon oxide ($SiO_2$) and/or a borophosphosilicate glass (BPSG). In an example, the insulation layer 11 comprises a lower oxidation layer and an upper BPSG layer.

The insulation layer 11 can cover the semiconductor body 10, e.g., not only in the active regions 210, but also at the scribeline regions 220. For example, the insulation layer 11 covers substantially the entire semiconductor body 10 of the wafer 200. The insulation layer 11 may be arranged in a horizontal manner, e.g., such that a transition between the insulation layer 11 and the semiconductor body 10 defines a substantially horizontal plane. For example, both an upper surface 119 and the lower surface 118 of the insulation layer 11 (cf. FIGS. 3A-C) define a substantially horizontal plane.

Within the active regions 210, e.g., within their respective active areas (cf. reference numeral 180 in FIG. 2B), the insulation layer 11 may be locally penetrated by contact means, e.g., contact stripes and/or contact plugs 154 (cf. FIGS. 3A-C), that are arranged and configured to contact a section of the semiconductor body 10, for example a semiconductor source region and/or a semiconductor body region and/or a semiconductor channel region (cf. reference numeral 102 in FIGS. 3A-C), or an electrode (cf. reference numerals 151, 153 in FIG. 3C). For example a plurality of trenches 15 may extend into the semiconductor body 10 along the vertical direction Z and may include trench electrodes 151, 153 that are to be contacted. For example, such trench electrodes can include control electrodes 153 (FIG. 3C) that may need to be electrically connected to a control terminal structure 150 (cf. FIG. 1C), e.g., a gate runner. Further, such trench electrodes can include field electrodes 151 that may need to be electrically connected to a load terminal structure 110. For example, such load terminal structure 110 and/or such control terminal structure 150 may be arranged above the insulation layer 11, and said contact means 154 penetrating the insulation layer 11 may serve as an electrical connection between these terminal structures 110, 150 that are arranged on top of the upper surface 119 of the insulation layer 11 on the one side and, on the other side, the buried components (semiconductor regions and/or trench electrodes) that are arranged below the lower surface 118 of the insulation layer 11.

Further, a passivation structure 13 may be arranged above the insulation layer 11, e.g., exclusively within the active regions 210. For example, the passivation structure 13 covers the above mentioned control terminal structure 150 and load terminal structure 110, e.g., so as to provide for an electrical insulation between these terminal structures 110, 150.

In an example, the passivation structure 13 may include or is made of an insulating material, e.g., imide. The passivation structure 13 may be configured to provide for an encapsulation. In addition, the passivation structure 13 may be covered by a further insulating structure 17, e.g., including or made of an epoxy material.

For example, the passivation structure 13 does not extend into the scribeline regions 220, but terminates within an edge termination region (cf. reference numeral 190 in FIG. 2B, also referred to as "high voltage termination region") of the power semiconductor die 100 included in the respective active region 210, e.g., by means of a termination edge 131.

As illustrated in more detail in FIG. 1C, the passivation structure 13 can be arranged above the insulation layer 11 and so as to expose the section 111 of the insulation layer 11. Further, the passivation structure 13 can be arranged above the insulation layer 11 so as to cover a section 112 of the insulation layer 11. For example, the covered insulation layer sections 112 are exclusively arranged within the active regions 210.

E.g., within the active area 180, the passivation layer 13 may cover substantially the entire insulation layer 11.

The exposed insulation layer section 111 may extend into each of the active region 210 and the scribeline region 220. For example, the first subsection 1111 of the exposed insulation layer section 111 extends into the active region 210. A second subsection 1112 of the exposed insulation layer section 111 can be arranged within the scribeline region 220.

As explained above, the scribeline region 220 can be designated to be subjected to a separation processing step, wherein, for example, a laser beam or a sawing blade may be directed to the scribeline region 220, e.g., onto the surface of the second insulation layer subsection 1112.

Thus, in an example, once processing of the active regions 210 is finished, the wafer 200 may be subjected to a separation processing step, e.g., a dicing (e.g., laser dicing) or sawing processing step. During such separation processing step, the wafer 200 can be divided, along the scribeline regions 220, into the separate dies 100 which may then be packaged and shipped to the customer. For example, each scribeline region 220 includes a dicing (sawing) line (only illustrated in FIG. 1C, cf. reference numeral 222) at the second insulation layer subsection 1112, along which a laser beam or sawing blade is directed for carrying out the separation.

A width of the second insulation layer subsection 1112, e.g., along the first lateral direction X, can be within the range of some 10 μm, e.g., within the range of 10 μm to 150 μm, e.g., 60 μm. For example, the width of the second insulation layer subsection 1112 is chosen such that a laser beam or sawing blade with a diameter/thickness of, e.g., 20 μm and a lateral deviation of, e.g., +/−20 μm can be guided along the second insulation layer subsection 1112, e.g., without subjecting the first insulation layer subsection 1111 to the laser beam/sawing blade.

For example, the power semiconductor die 100 as illustrated in FIG. 2A has been a part of the semiconductor wafer 200 and has been cut out of the semiconductor wafer 200, wherein, thereby, the die edge 105 may have become into being. As illustrated in FIG. 2B, the power semiconductor die 100 may have the active area 180 and the edge termination region 190 that surrounds the active area 180 and that is terminated by the die edge 105. The passivation structure 13 may be arranged so as to cover substantially the entire active area 180 and, only partially, the edge termination region 190. Of course, the passivation structure 13 may be partially structured within the active area 180, e.g., so as to allow external contacts, e.g., bonding wires, to contact a load terminal structure and/or a control terminal structure arranged on the insulation layer 11, e.g. the load terminal structure 110. As explained above, the back side metallization 212 mentioned with respect to FIG. 3A can form another load terminal structure of the power semiconductor die 100, e.g. load terminal structure 120 at the back side of the power semiconductor die 100.

FIGS. 1B-C both schematically and exemplarily illustrate a section of a horizontal projection of the semiconductor wafer 200, said section including four adjacent active regions 210. For example, a first separating processing step has been carried out along a dicing line 222 (cf. FIG. 1C) included in the scribeline regions 220. For example, due to such first separating processing step, the second insulation layer subsection 1112 (cf. FIG. 1) may have been at least partially removed. The crosshatched area illustrates the first insulation layer subsections 1111 that extend laterally from the respective die edges 105 to the outermost termination edges 131 of the passivation structures 13.

As has further been explained above, the passivation structure 13 may be structured, e.g., so as to expose a terminal structure, e.g., terminal structure 150, which may be a control terminal structure, and comprise, for example, a gate runner. The terminal structure 150, e.g., including the gate runner, may be at least partially covered by an encapsulation, e.g., made of an insulating material, e.g., imide.

FIGS. 3A-C—as already mentioned above—each schematically and exemplarily illustrate a section of a vertical cross-section of the semiconductor wafer 200 with two adjacent active regions 210.

Accordingly, a plurality of trenches 15 may extend into the semiconductor body 10 along the vertical direction Z. Each of the plurality of trenches 15 may include a trench electrode 151 and a trench insulator 152 that insulates the trench electrode 151 from the semiconductor body 10. The trenches 15 may be arranged both within the active regions 210 and within the scribeline region 220.

For example, a first subset of the plurality of trenches 15 can be arranged in the active region 210, wherein, in FIGS. 3A-C, only a respective section of the edge termination regions (cf. reference numeral 190 in FIG. 2B) is illustrated. The first subset can include at least one trench 15 that laterally overlaps with the first insulation layer subsection 1111. In the illustrated examples, seven (FIG. 3A) or six (FIG. 3B) or four (FIG. 3C) trenches 15 laterally overlap with the first insulation layer subsection 1111 in the active region 210.

A second subset of the plurality of trenches 15 can be arranged in the scribeline region 220, wherein each of the second subset of the plurality of trenches 15 laterally overlaps with the second insulation layer subsection 1112.

In accordance with an example, the first subset of the plurality of trenches 15 and the second subset of the plurality of trenches 15 are of identical spatial dimensions, e.g., with respect to the total extension along the vertical direction Z and/or with respect to the trench width along the first lateral direction X. Additionally or alternatively, the first subset of the plurality of trenches 15 and the second subset of the plurality of trenches 15 are arranged in accordance with the same trench pattern, e.g., with respect to a lateral distance along the first lateral direction X between two adjacent trenches 15 (also referred to as "pitch"). In another example, the trenches 15 within the scribeline regions 220 can be arranged in accordance with a greater pitch as compared to the trenches 15 within the active regions 210.

For example, the trench formation process carried out for forming the trenches within the active area 180 of each power semiconductor die 100 of the active regions 210, e.g., for forming control trenches, gate trenches, field plate trenches and the like, is simultaneously carried out, in a similar or identical fashion, within the scribeline regions 220, which can be beneficial regarding uniformity. Thus, even though such trenches 15 in the scribeline regions 210 are not needed for controlling operation of the power semiconductor dies 100, they may nevertheless be formed within these regions 220 so as to provide for a high uniformity within the entire wafer 200.

Further, a plurality of contact plugs 154 can be employed for contacting the trench electrodes 151 and/or the semiconductor body 10, wherein each of the contact plugs 154 may extend from the upper surface 119 of the insulation layer 11 to the lower surface 118 of the insulation layer 11. The use of such contact plugs 154 is generally known to the skilled person. For example, depending on the design of the power semiconductor dies 100, e.g., a needle trench design or a stripe trench design, such contact plugs 154 may be configured as contact stripes or as contact needles. They may penetrate through the insulation layer 11 and extend further along the vertical direction Z as compared to the lower surface 118 of the insulation layer 11, e.g., so as to contact a region of the semiconductor body 10, e.g., a source region, a channel region or the body region (reference numeral 102) within the active region 180.

For example, as illustrated in FIGS. 3A-C, a frontside metallization 110 is arranged above the insulation layer 11 and below the passivation structure 13, wherein the frontside metallization 110 is electrically connected to the semiconductor body 10 in the active area 180 of the power semiconductor die 100. This front side metallization 110 may form a part of a load terminal structure of the power semiconductor die 100, e.g., a part of a source terminal structure, an emitter terminal structure or an anode terminal structure. As already explained, the active area 180 can be laterally displaced from the first insulation layer subsection 1111. For example, in order to provide for said electrical connection between the front side metallization/load terminal structure 110 and the semiconductor body 10 and/or between the front side metallization 110 and the trench electrodes 151, said contact plugs 154 may be employed.

In accordance with the examples schematically illustrated in each of FIGS. 3A-C, an interruption structure 14 may be provided that is covered by the passivation structure 13. For example, also the interruption structure 14 may penetrate the insulation layer 11, e.g., at the covered insulation layer section 112. As illustrated in FIGS. 3A-C, the interruption structure 14 may comprise an interruption contact plug 144 or an interruption contact well 142, wherein the contact plug 144 or, respectively, the interruption contact well 142 may electrically contact the semiconductor body 10.

For example, the interruption structure 14 is configured to block a laterally extending peel-off of the insulation layer 11, wherein the laterally extending peel-off of the insulation layer may under circumstances occur during the wafer separation processing stage.

The total number of trenches 15 included in the scribeline region 220 may depend on a trench pattern that is being employed for forming the trenches 15 in the active region 210. For example, for power semiconductor dies with a lower voltage rating, the trench pattern with a comparatively small pitch may be employed (cf. FIG. 3A-C), whereas for power semiconductor dies with a higher voltage rating, the trench but in with a comparatively larger pitch may be employed.

Figure 4:
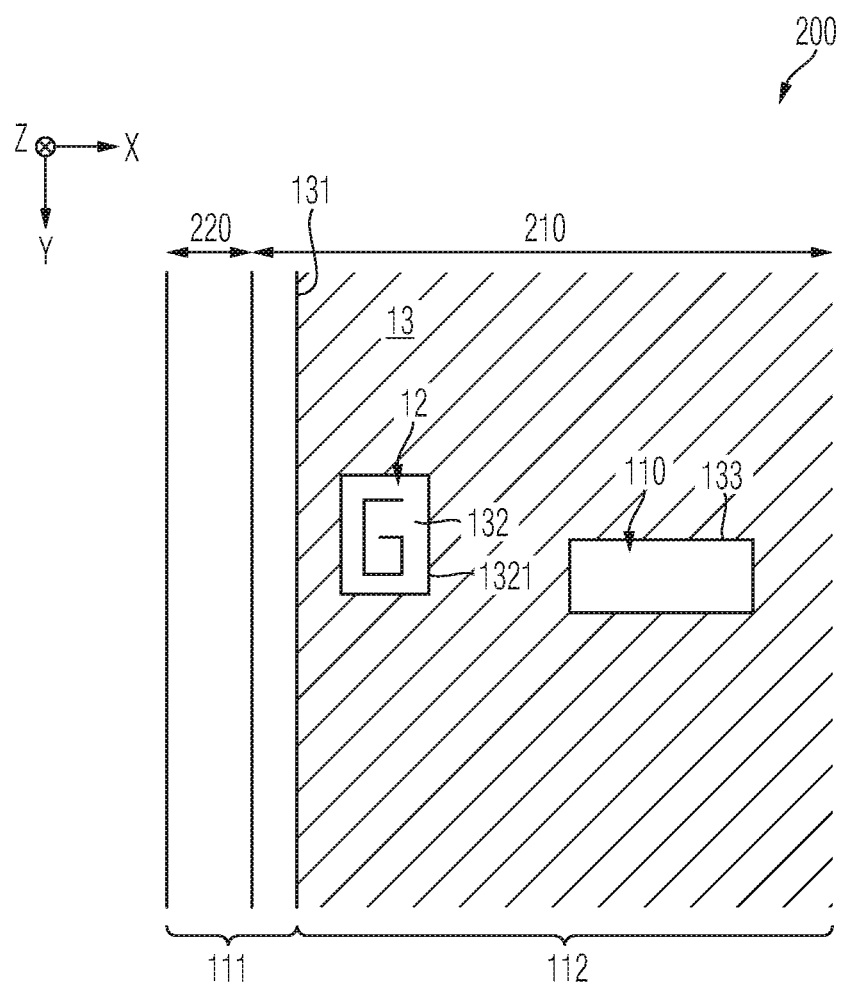
FIG. 4 schematically and exemplarily illustrates a section of a horizontal projection of a semiconductor wafer in accordance with one or more embodiments.

FIG. 4 schematically and exemplarily illustrates a section of a horizontal projection of a semiconductor wafer 200 in accordance with one or more embodiments. The semiconductor wafer 200 has a semiconductor body 10 (not visible in FIG. 4); an insulation layer 11 on the semiconductor body 10; an active region 210 with a power semiconductor die 100 (not visible in FIG. 4), the active region 210 forming a part of the semiconductor body 10; a scribeline region 220 arranged adjacent to the active region 210; a passivation structure 13 arranged above the insulation layer 11 and so as to expose a section 111 of the insulation layer 11, the exposed section 111 being terminated by a termination edge 131 of the passivation structure 13.

Regarding optional implementations of the semiconductor body 10, the insulation layer 11, the active region 210, the power semiconductor die 100, the scribeline region 210, and of the passivation structure 13, it is referred to description above.

In an embodiment, the wafer 200 comprises an optically detectable reference feature 12 configured to serve as a reference position during a wafer separation processing stage.

The optically detectable reference feature 12 is: (i) included in the active region 210, (ii) spatially displaced from the termination edge 131, and (iii) exposed by the passivation structure 13.

Figure 9:
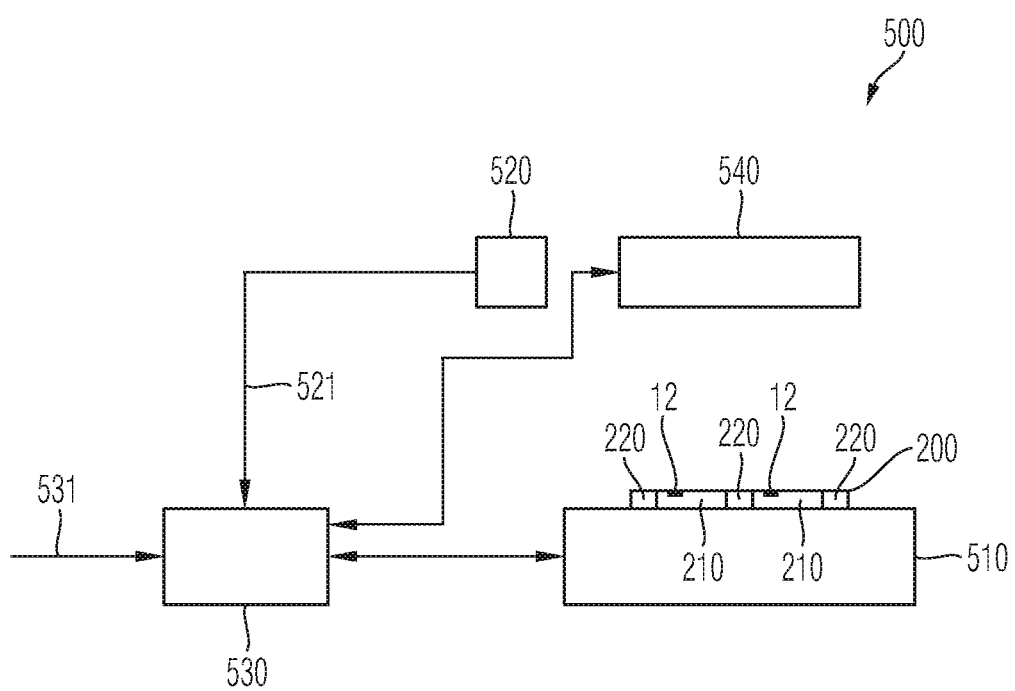
FIG. 9 schematically and exemplarily illustrates a block diagram of a semiconductor wafer separation apparatus in accordance with one or more embodiments.

The optically detectable reference feature 12 may be configured to be optically detected by a component of a semiconductor wafer separation apparatus (cf. FIG. 9). As used herein, the term "optically detectable" may refer to configuration that can be detected by means of processing an image of the wafer 200, the image including a representation of the optically detectable reference feature 12, e.g., an image of the front side 290 of the wafer 200. For example, such image of the wafer 200 may be taken by means of a digital camera positioned above the wafer 200. For example, in order to optically detect the reference feature 12, it is not necessary to process the wafer 200 besides placing the wafer 200 into a field of view of the digital camera.

For example, the course of the scribeline region 220 (along which the wafer separation must occur) may be defined with respect to the position of the optically detectable reference feature 12, e.g., by means of corresponding course data. For carrying out the wafer separation, the position of the optically detectable reference feature 12 may be determined and, based on the determined position, the wafer 200 may be divided into a plurality of separate power semiconductor dies 100 by breaking (e.g., by the dicing or sawing) the wafer 200 along the scribeline region 220.

In an embodiment, the optically detectable reference feature 12 is entirely exposed to the environment, i.e., at least above the section of the insulation layer 11 covering and/or including the optically detectable the reference feature 12, there is not arranged any component of the wafer 200. For example, the optically detectable reference feature 12 is not covered.

For example, the passivation structure 13 comprises an opening 132 that exposes the optically detectable reference feature 12. The opening 132 may exhibit a maximum lateral extension (e.g., in both the first and the second lateral direction) substantially as great as a width of the scribeline region 220, e.g., within the range of 20% to 200% of the width of the scribeline region 220, which may be, as indicated above, within the range of some 10 μm.

The opening 132 may be spatially confined by a closed opening edge 1321 of the passivation structure 13. In an embodiment, a minimum distance between the closed opening edge 1321 and the termination edge 131 is within the range of 5 μm to 50 μm.

Figure 5:
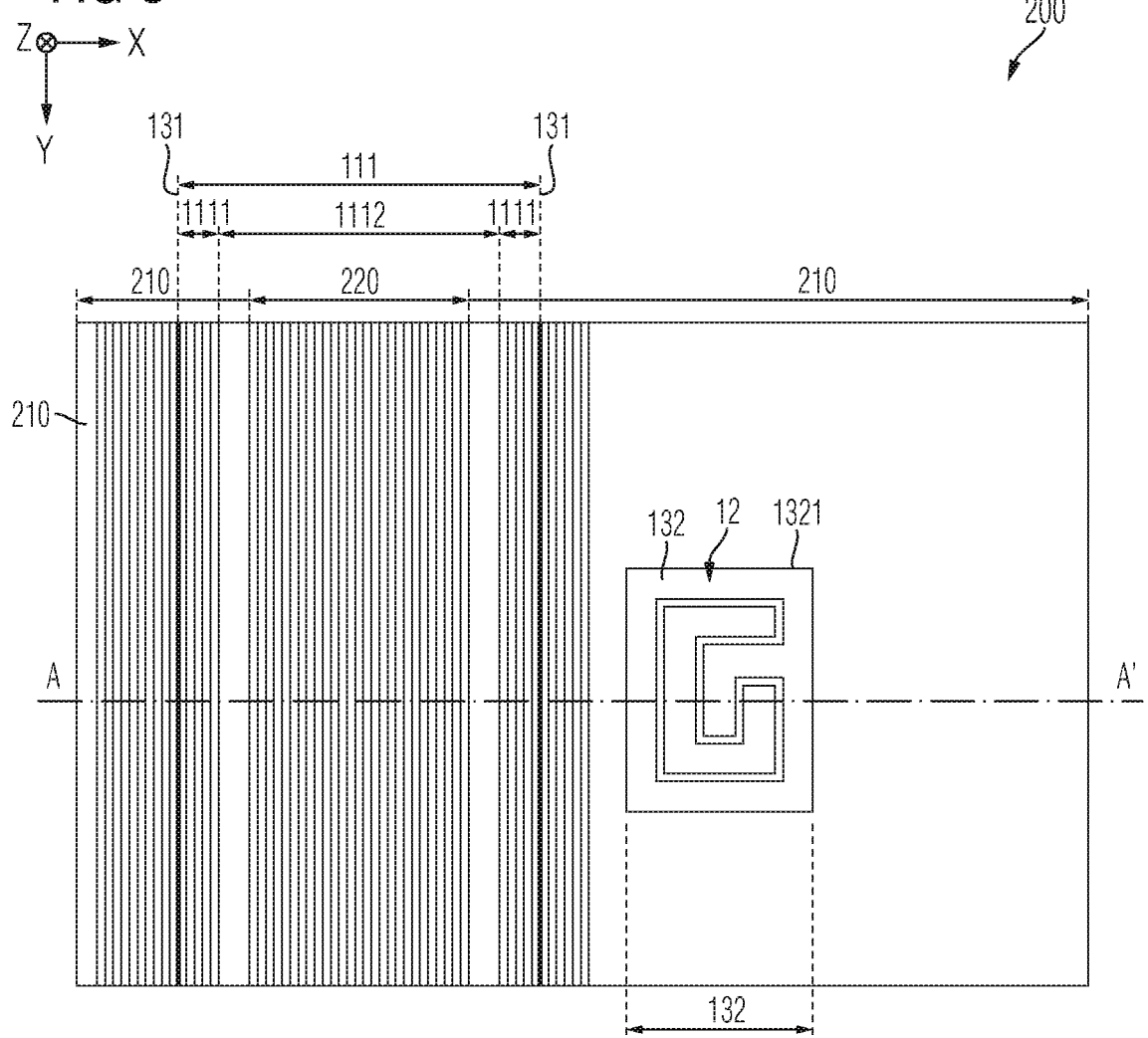
FIG. 5 schematically and exemplarily illustrates a section of a horizontal projection of a semiconductor wafer in accordance with one or more embodiments.
Figure 6:
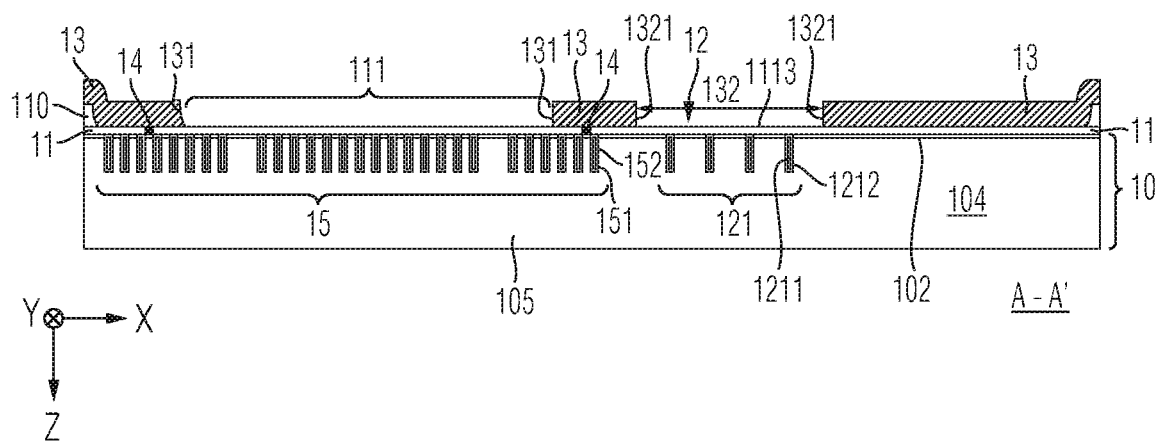
FIG. 6 schematically and exemplarily illustrates a section of a vertical cross-section of a semiconductor wafer in accordance with one or more embodiments.
Figure 7:
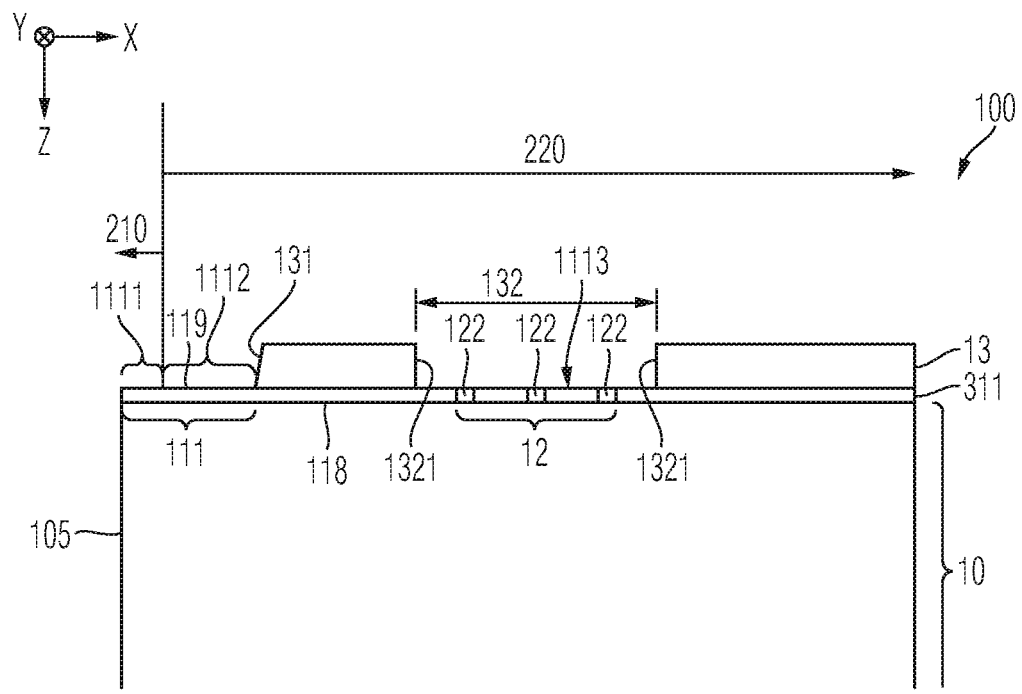
FIG. 7 schematically and exemplarily illustrates a section of a vertical cross-section of a power semiconductor die in accordance with one or more embodiments.

The opening 132 may not only expose the optically detectable reference feature 12, but also a subsection 1113 of the insulation layer 11 (cf. FIGS. 5 to 7). As will be explained in more detail below, the optically detectable reference feature 12 may for example extend into and/or underneath the subsection 1113 of the insulation layer 11 that is exposed by the opening 132.

Another opening 133 of the passivation structure 13 may for example expose a portion of terminal structure of the die 100, e.g., the load terminal structure 110 as mentioned above.

For example, the passivation structure 13 may exhibit a plurality of openings, and the opening 132 exposing the optically detectable reference feature 12 can be the opening that is arranged closest to the termination edge 131.

Hence, in an embodiment, the optically detectable reference feature 12 is spatially displaced from the termination edge 131 of the passivation structure 13 such that it is included within the active region 210 and not in the scribeline region 220. Further, the optically detectable reference feature 12 is not covered by the passivation structure 13, but exposed by the passivation structure 13, thereby allowing a device (cf. reference numeral 520 in FIG. 9) to optically detect the optically detectable reference feature 12.

FIG. 5 schematically and exemplarily illustrates a section of a horizontal projection of the semiconductor wafer 200 in accordance with one or more embodiments, and FIG. 6 schematically and exemplarily illustrates a section of a vertical cross-section of the semiconductor wafer 200 in accordance with one or more embodiments, wherein the illustrated cross-section corresponds to a vertical cut at line AA' shown in FIG. 5.

Accordingly, two adjacent active regions 210 may be laterally separated from each other by means of exposed section 111 of the insulation layer 11 spatially confined by the termination edges 131 of the passivation structures 13. The exposed section 111 of the insulation layer 11 extends into the scribeline region 220. For example, the portion of the semiconductor body 10 that belongs to the scribeline region 220 is partially or entirely covered by the exposed section 111 of the insulation layer 11. As already indicated further above, the first subsections 1111 of the exposed insulation layer section 111 can extend into the active regions 210, and the second subsection 1112 of the exposed insulation layer section 111 can extend into the scribeline region 220.

The optically detectable reference feature 12 is arranged within one of the active regions 210 (wherein, of course, the wafer 200 may comprise one or more additional optically detectable reference features 12 that may be arranged in the same or other active regions 210). As already explained above, the optically detectable reference feature 12 is spatially displaced from the termination edge 131. For example, the course of the scribeline region 210 is devoid of any portion of the optically detectable reference feature 12; e.g., in terms of structural configuration, the optically detectable reference feature 12 does not spatially confine the course of the scribeline region 210.

As illustrated in FIG. 6, the optically detectable reference feature 12 can extend into the semiconductor body 10, i.e., underneath the exposed subsection 1113 of the insulation layer 11. For example, the optically detectable reference feature 12 comprises a trench structure 121 that extends into the semiconductor body 10. The trench structure can include one or more separate trenches or, as illustrated in FIGS. 6 and 7, a closed trench structure formed by a contiguous trench that extends into the semiconductor body 10.

For example, the wafer 200, e.g., the active region 210 and/or the scribeline region 220, includes processed portions formed within a horizontal sublayer 104 of the semiconductor body 10, wherein the horizontal sublayer 104 is arranged below and, optionally, in contact with the insulation layer 11, and wherein the optically detectable reference feature 12 extends into the horizontal sublayer 104. For example, the horizontal sublayer 104 is an epitaxially grown semiconductor region and/or is arranged above a substrate region 105 of the semiconductor body 105.

The processed portions of the horizontal sublayer 104 of the semiconductor body 10 may include doped semiconductor regions, e.g., a body region 102 (e.g., p-doped) and/or a source region (e.g., n-doped, not illustrated), guard ring regions or channel stopper regions (not illustrated) and the like. The processed portions of the horizontal sublayer 104 of the semiconductor body 10 may further include trenches 15, as has already been explained with respect to FIGS. 3A-C.

In an embodiment, the optically detectable reference feature 12 and at least one component of the processed portions 102, 15 exhibit a common vertical extension range of at least 20%, of at least 50% or even of at least 80% of the total extension of the at least one component of the processed portions 102, 15 along the vertical direction Z.

For example, the trench structure 121 of the optically detectable reference feature 12 is produced in the same manner, e.g., simultaneously with the trenches 15. Hence, the same level of accuracy that applies during processing the trenches 15 may equivalently apply to the optically detectable reference feature 12. Thus, controlling the wafer separation processing stage based on the position and/or the layout of the optically detectable reference feature 12 can be carried out with comparatively high accuracy. E.g., in contrast, due to the process, the course of the termination edge 131 of the passivation structure 13 may exhibit an undesired variation of some micrometers which would correspondingly influence the wafer separation processing stage if the same would be based on the course of the termination edge 131.

For example, the trench(es) of the trench structure 121 may hence also include a trench electrode 1211 that is insulated from the semiconductor body 10 by means of a trench insulator 1222. Further, the optically detectable reference feature 12 may exhibit the substantially same total extension along the vertical direction Z (depth) as the plurality of said trenches 15. But, as the layout of the trench structure 121 of the optically detectable reference feature 12 can be different as compared to the layout of the trenches 15 (which may, e.g., be stripe trenches of equal form), the total depth of the trench(es) of the trench structure 121 may be slightly different from the depth of the trenches 15. E.g., a width of the trench(es) of the trench structure 121 of the optically detectable reference feature 12 can be greater as the respective width of the trenches 15, and, depending on the process, this may yield a greater depth of the trench structure 121.

It shall be understood that the insulation layer 11 can be transparent; e.g., transparent for a detector (cf. reference numeral 520 mentioned further below), e.g., an optical microscope.

Further, in contrast to the trenches 15 that may be arranged within active region 210 and that can be designated to contribute in the active operation of the power semiconductor die 100, e.g., for the purpose of controlling a load current, the trench structure 121 of the optically detectable reference feature 12, even though forming a part of the active region 210, does for example not serve the purpose of controlling the active operation of the power semiconductor die 100, but rather serves, e.g., exclusively, the purpose of being optically detected, e.g., located, by means of a semiconductor wafer separation apparatus, and hence serves for nothing else as a landmark for carrying out the wafer separation processing stage.

For example, the trench electrode(s) 1211 of the trench structure 121 of the optically detectable reference feature 12 may be electrically floating. Hence, the trench electrode(s) 1211 of the trench structure 121 of the optically detectable reference feature 12 are not electrically connected to the load terminal structure 110 or to the control terminal structure 150 of the power semiconductor die 100.

In an embodiment, the optically detectable reference feature 12 exhibits, in a horizontal cross-section, a non-symmetrical layout. An example of the non-symmetrical layout is illustrated in FIG. 6; accordingly, the optically detectable reference feature 12 exhibits, in a horizontal cross-section, a non-symmetrical layout in the form of closed G-course. Of course, other non-symmetrical layouts are possible, e.g., an L-course or the like. The non-symmetrical layout may facilitate control of the wafer separation processing stage, as different horizontal (i.e., lateral) directions may be orientated based on one and the same optically detectable reference feature 12. E.g., based on the position and layout of the optically detectable reference feature 12, a movement along the scribelines 220 necessary for carrying out the wafer separation can be controlled more reliably in both the first lateral direction X and the second lateral direction Y based one and the same optically detectable reference feature 12.

Generally, it is possible that the optically detectable reference feature 12 is made of one or more materials different from both the material of the passivation structure 13 and a metal. Hence, in an embodiment, the optically detectable reference feature 12 is neither a portion of the passivation structure 13 nor a portion of the terminal structures that may be included in the active area 210. As explained above, the optically detectable reference feature 12 can be produced simultaneously with portions implemented within the horizontal sublayer 104, and, hence, the optically detectable reference feature 12 can be based on materials like a poly-doped semiconductor material (e.g., trench electrode 1211) and a semiconductor oxide (e.g., the trench insulator 1222).

Further, in an embodiment, the optically detectable reference feature 12 does also not form a portion of the insulation layer 11, and the optically detectable reference feature 12 is made of a material different from the material of the insulation layer 11.

Presented herein is also a power semiconductor die. The power semiconductor die has: a semiconductor body; an insulation layer on the semiconductor body; an active region, the active region forming a part of the semiconductor body; a remaining portion of a semiconductor wafer scribeline region arranged adjacent to the active region; a passivation structure arranged above the insulation layer and so as to expose a section of the insulation layer, the exposed section being terminated by a termination edge of the passivation structure; an optically detectable reference feature configured to serve as a reference position during a wafer separation processing stage. The optically detectable reference feature is: (i) included in the active region, (ii) spatially displaced from the termination edge, and (iii) exposed by the passivation structure.

Regarding optional implementations of the components of the power semiconductor die (cf. reference numeral 100 in the drawings), it is referred to the above. E.g., what has been described above with respect to the semiconductor body 10, the insulation layer 11 the active region 210, scribeline region 220, the passivation structure 13 and the optically detectable reference feature 12 may equally apply to the corresponding components of the power semiconductor die presented herein. FIG. 7 schematically and exemplarily illustrates a section of a vertical cross-section of the power semiconductor die 100 in accordance with one or more embodiments.

For example, the optically detectable reference feature 12 comprises one or more contact plugs 122 that extend into the insulation layer 11. For example, the contact plugs 122 penetrate the insulation layer 11, e.g., so as to co-planarily terminate with both the upper surface 119 and the lower surface 118 of the insulation layer 11.

In an embodiment, the optically detectable reference feature 12 may comprise, irrespective of being part of the entire wafer 200 or the separate die 100, both the contact plugs 122 and the trench structure 121 mentioned above. For example, the contact plugs 122 may laterally overlap with the trench structure 121, e.g., so as to contact the trenches (e.g., the trench electrodes 1211).

As described above, the optically detectable reference feature 12 may hence exhibit a vertical overlap with at least one of the insulation layer 11 and the semiconductor body 10. Not illustrated herein, but also possible, is that the optically detectable reference feature 12 alternatively or additionally vertically overlaps with another layer section that is arranged below (but still exposed by) the passivation structure 13, e.g., with a diffusion barrier layer or a tungsten layer.

Hence, it shall be understood that the optically detectable reference feature 12 may comprise, instead or in addition to said trench structure 121, a structure comprising a section of a diffusion barrier layer and/or a section of a tungsten layer. In another embodiment, the optically detectable reference feature 12 may comprise, instead or in addition to said trench structure 121, a contact structure, e.g., as exemplarily explained with respect to FIG. 7.

Figure 8:
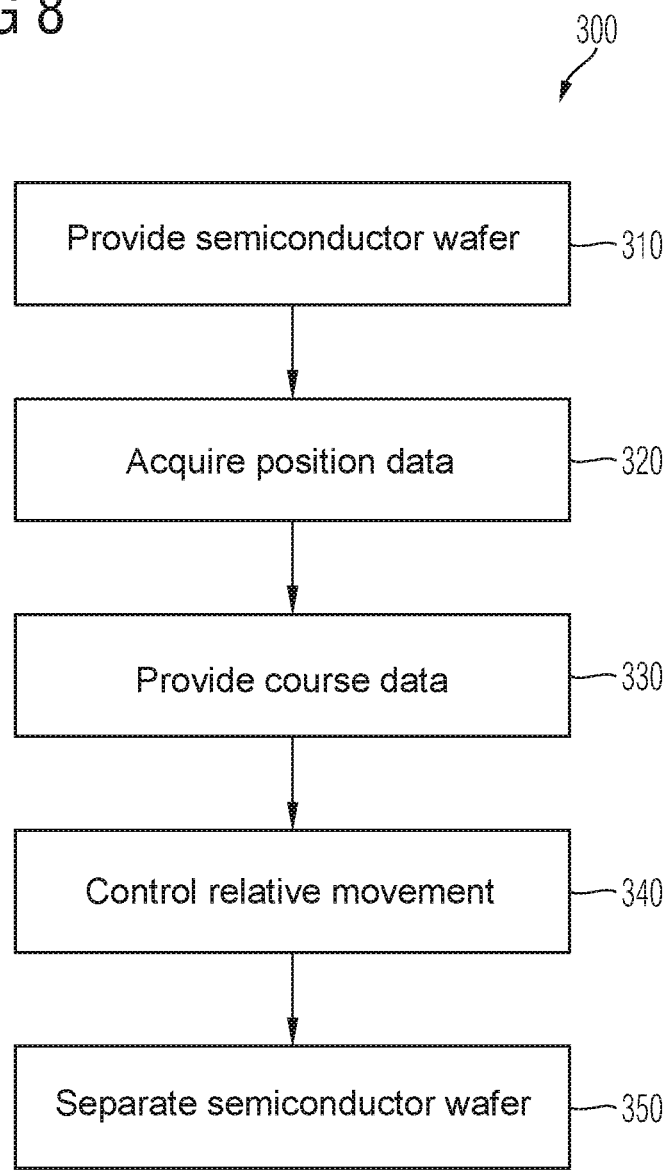
FIG. 8 schematically and exemplarily illustrates a flow diagram of a method of processing a semiconductor wafer in accordance with one or more embodiments.

FIG. 8 schematically and exemplarily illustrates a flow diagram of a method 300 of processing a semiconductor wafer in accordance with one or more embodiments. The method 300 comprises providing (in step 310) the semiconductor wafer, wherein the semiconductor wafer has: a semiconductor body; an insulation layer on the semiconductor body; an active region with a power semiconductor die, the active region forming a part of the semiconductor body; a scribeline region arranged adjacent to the active region; a passivation structure arranged above the insulation layer and so as to expose a section of the insulation layer, the exposed section being terminated by a termination edge of the passivation structure; an optically detectable reference feature configured to serve as a reference position during a wafer separation processing stage. The optically detectable reference feature is: (i) included in the active region, (ii) spatially displaced from the termination edge, and (iii) exposed by the passivation structure.

The method 300 further comprises: acquiring (in step 320) position data indicative of a position of the optically detectable reference feature; and controlling (in step 340) a relative movement between the semiconductor wafer and a wafer separation device based on the position data.

Regarding optional implementations of the components of the provided (cf. step 310) semiconductor wafer (cf. reference numeral 200 in the drawings), it is referred to the above. E.g., what has been described above with respect to the semiconductor body 10, the insulation layer 11 the active region 210, scribeline region 220, the passivation structure 13 and the optically detectable reference feature 12 may equally apply to the corresponding components of the semiconductor wafer processed in accordance with method 300.

In an embodiment, acquiring 320 the position data includes locating the optically detectable reference feature 12 and, optionally, also determining a layout of the optically detectable reference feature 12. E.g., acquiring 320 the position data includes carrying out an optical character recognition (OCR) processing step, e.g., the OCR processing step is carried out on an image of the provided wafer 200 that has been captured by means of a digital camera. The general concepts of image processing that may be carried in order to acquire the position data indicative of the position (i.e., location) of the optically detectable reference feature 12 and, optionally, also indicative of the layout of the optically detectable reference feature 12, are known to the skilled person and hence not explained in greater detail herein.

In a further embodiment, the method 300 includes separating (in step 350) the semiconductor wafer 200 into at least two wafer components (i.e., in at least two separate power semiconductor dies 100) by causing the wafer separation device to break (e.g., saw, laser dice and/or plasma etch) the semiconductor wafer 200 along the scribeline region 210 while maintaining the optically detectable reference feature 12.

Breaking the semiconductor wafer 200 along the scribeline region 210 may include at least one of a laser dicing processing step, a sawing processing step and a plasma etching processing step.

In accordance with one or more embodiments, the optically detectable reference feature 12 is hence maintained during the wafer separation processing stage. Thus, one or more of the separate power semiconductor dies 100 may, after the wafer separation processing stage is finished, still be equipped with at least one respective optically detectable reference feature 12. For example, there is no need to remove the respective optically detectable reference feature 12 afterwards, and the separate power semiconductor dies 100 may be packaged while still exhibiting the optically detectable reference feature 12. However, within the course of further processing of the separate power semiconductor dies 100, the optically detectable reference feature 12 may then be covered by means of, e.g., a molding mass, or by means of another insulation structure. Hence, whereas the opening 132 of the passivation structure 13 may still expose the optically detectable reference feature 12, said opening 132 may then be filled with an insulating material. But, as indicated, the opening must not necessarily be filled, but may instead remain empty.

In a further embodiment, the method 300 further includes providing (in step 330, which may be carried out before or after or simultaneously with step 320) course data, the course data defining a course of the scribeline region 210 with respect to the position of the optically detectable reference feature 12, and wherein the controlling (step 340) the relative movement includes moving the semiconductor wafer 200 relative to the wafer separation device based on the course data. For example, the relative movement is caused by moving the wafer 200 and/or by moving the wafer separation device. Further, controlling 340 the relative movement between the semiconductor wafer 200 and the wafer separation device may occur independently from the course of the termination edge 131 of the passivation structure 13. Hence, in an embodiment, the course of the termination edge 131 of the passivation structure is not taken into account when dividing the wafer 200 into the plurality of power semiconductor dies 100.

FIG. 9 schematically and exemplarily illustrates a block diagram of a semiconductor wafer separation apparatus 500 for separating a semiconductor wafer into a plurality of power semiconductor dies in accordance with one or more embodiments. The apparatus 500 comprises a receiver device 510 configured to receive the semiconductor wafer. The semiconductor wafer has: a semiconductor body; an insulation layer on the semiconductor body; an active region with a power semiconductor die, the active region forming a part of the semiconductor body; a scribeline region arranged adjacent to the active region; a passivation structure arranged above the insulation layer and so as to expose a section of the insulation layer, the exposed section being terminated by a termination edge of the passivation structure; an optically detectable reference feature configured to serve as a reference position during a wafer separation processing stage. The optically detectable reference feature is: (i) included in the active region, (ii) spatially displaced from the termination edge, and (iii) exposed by the passivation structure.

The apparatus 500 further comprises: a detector 520 configured to acquire position data 521 indicative of a position of the optically detectable reference feature; a computing device 530 configured to receive the position data 521 and course data 531, the course data 531 being associated with the semiconductor wafer and defining a course of the at least one scribeline region with respect to the position of the at least one optically detectable reference feature; and a wafer separation device 540 coupled to the computing device 530 and configured to separate the semiconductor wafer into the plurality of power semiconductor dies, wherein the computing device 530 is configured to control the wafer separation device 540 based on the position data 521 and the course data 531.

Regarding optional implementations of the components of the received (cf. receiver device 510) semiconductor wafer (cf. reference numeral 200 in the drawings), it is referred to the above. E.g., what has been described above with respect to the semiconductor body 10, the insulation layer 11 the active region 210, scribeline region 220, the passivation structure 13 and the optically detectable reference feature 12 may equally apply to the corresponding components of the semiconductor wafer received by the apparatus 500.

The apparatus 500 may be configured to move the receiver device 510 and the wafer separation device 540 relative to each other, e.g., by keeping the wafer separation device 540 stationary and by moving the receiver device 510 (i.e., the wafer 200 received therewith). To this end, displacement means (not illustrated) may be included by the apparatus 500, and the computing device 530 may be configured to control the relative movement by correspondingly controlling the displacement means. For example, for controlling the relative movement, the computing device 530 may be operatively coupled to at least one of the wafer separation device 540 and the receiver device 510.

The wafer separation device 540 may be configured to carry out at least one of a laser dicing, a sawing and a plasma etching processing step so as to effect the wafer separation along the scribeline 220.

The detector 520 may be configured to acquire an image of the wafer 200 and to carry out an OCR processing step so as to acquire the position data, wherein the position data may be indicative of the position (i.e., location) of the optically detectable reference feature 12 and, optionally, also indicative of the layout of the optically detectable reference feature 12, as explained above.

For example, the detector 520 includes an optical microscope.

The detector 520 can provide the position data to the computing device 530. The computing device 530 may comprise a controller of the semiconductor wafer separation apparatus 500 and may comprise several, e.g., distributed, computing subunits for carrying out appropriate control of the semiconductor wafer separation apparatus 500.

The course data 531 can be provided to the computing device 530 in any suitable manner, e.g., by means of communication interface. For example, the course data may be generated during the semiconductor wafer production process, e.g., after forming the one or more optically detectable reference features 12. E.g., each semiconductor wafer is uniquely associated with an individual set of course data 531; once the apparatus 500 identifies the received semiconductor wafer 200, it may determine the course data 531 associated therewith.

As explained above, the course data may define the course of the scribeline 210 relative to the position/layout of the optically detectable reference feature 12. Hence, based on the position data 521 and based on the course data 531, the computing device 530 may control the wafer separation processing stage.

In accordance with one or more embodiments described herein, the optically detectable reference feature 12 forms an alignment structure based on which the wafer separation processing stage, e.g. the control of the relative movement between a wafer separation device and the wafer during the wafer separation, can be carried out. For example, if the wafer separation is based on a sawing processing step, the optically detectable reference feature 12 forms the sawing alignment structure, wherein the wafer separation may certainly, as has been explained above, additionally or alternatively be based on a laser dicing processing step and/or the plasma etching processing step.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description. As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor wafer, comprising:
   a semiconductor body;
   an insulation layer on the semiconductor body;
   an active region with a power semiconductor die, the active region forming a part of the semiconductor body;
   a scribeline region arranged adjacent to the active region;
   a passivation structure arranged above the insulation layer and exposing a section of the insulation layer, the exposed section of the insulation layer being terminated by a termination edge of the passivation structure; and
   an optically detectable reference feature configured to be a reference position during a wafer separation processing stage,
   wherein the optically detectable reference feature is included in the active region, spatially displaced from the termination edge, and exposed by the passivation structure.

2. The semiconductor wafer of claim 1, wherein the optically detectable reference feature extends into the semiconductor body.

3. The semiconductor wafer of claim 1, wherein the optically detectable reference feature comprises a trench structure.

4. The semiconductor wafer of claim 3, wherein the trench structure includes at least one electrically floating trench electrode.

5. The semiconductor wafer of claim 1, further comprising processed portions formed within a horizontal sublayer of the semiconductor body, the horizontal sublayer being arranged below and in contact with the insulation layer, wherein the optically detectable reference feature extends into the horizontal sublayer.

6. The semiconductor wafer of claim 5, wherein the optically detectable reference feature and at least one component of the processed portions have a common vertical extension range of at least 20% of a total extension of the at least one component of the processed portions along a vertical direction.

7. The semiconductor wafer of claim 6, wherein the at least one component of the processed portions includes a plurality of trenches, and wherein the optically detectable reference feature has substantially the same total extension along the vertical direction as the plurality of the trenches.

8. The semiconductor wafer of claim 1, wherein the optically detectable reference feature extends into a subsection of the exposed section of the insulation layer.

9. The semiconductor wafer of claim 1, wherein the optically detectable reference feature comprises one or more contact plugs that extend into the insulation layer.

10. The semiconductor wafer of claim 1, wherein the optically detectable reference feature has, in a horizontal cross-section, a non-symmetrical layout.

11. The semiconductor wafer of claim 1, wherein the optically detectable reference feature is made of one or more non-metal materials different from a material of the passivation structure.

12. The semiconductor wafer of claim 1, wherein a spatial confinement of a course of the scribeline region is devoid of any portion of the optically detectable reference feature.

13. The semiconductor wafer of claim 1, wherein the exposed section of the insulation layer at least partially covers the scribeline region.

14. The semiconductor wafer of claim 1, wherein a first subsection of the exposed section of the insulation layer extends into the active region, and wherein a second subsection of the exposed section of the insulation layer extends into the scribeline region.

15. A method of processing a semiconductor wafer having a semiconductor body, an insulation layer on the semiconductor body, an active region with a power semiconductor die, the active region forming a part of the semiconductor body, a scribeline region arranged adjacent to the active region, a passivation structure arranged above the insulation layer and exposing a section of the insulation layer, the exposed section of the insulation layer being terminated by a termination edge of the passivation structure, and an optically detectable reference feature configured to be a reference position during a wafer separation processing stage, wherein the optically detectable reference feature is included in the active region, spatially displaced from the termination edge, and exposed by the passivation structure, the method comprising:
  acquiring position data indicative of a position of the optically detectable reference feature; and
  controlling a relative movement between the semiconductor wafer and a wafer separation device based on the position data.

16. The method of claim 15, wherein acquiring the position data comprises an optical character recognition processing step.

17. The method of claim 15, further comprising:
  providing course data which defines a course of the scribeline region with respect to the position of the optically detectable reference feature,
  wherein controlling the relative movement comprises moving the semiconductor wafer relative to the wafer separation device based on the course data.

18. The method of claim 15, further comprising:
  separating the semiconductor wafer into at least two wafer components by causing the wafer separation device to break the semiconductor wafer along the scribeline region while maintaining the optically detectable reference feature.

19. The method of claim 15, wherein controlling the relative movement between the semiconductor wafer and the wafer separation device occurs independently from a course of the termination edge of the passivation structure.

20. A power semiconductor die, comprising:
  a semiconductor body;
  an insulation layer on the semiconductor body;
  an active region forming a part of the semiconductor body;
  a remaining portion of a semiconductor wafer scribeline region arranged adjacent to the active region;
  a passivation structure arranged above the insulation layer and exposing a section of the insulation layer, the exposed section of the insulation layer being terminated by a termination edge of the passivation structure; and
  an optically detectable reference feature,
  wherein the optically detectable reference feature is included in the active region, spatially displaced from the termination edge, and exposed by the passivation structure.

21. A semiconductor wafer separation apparatus for separating a semiconductor wafer into a plurality of power semiconductor dies, the semiconductor wafer separation apparatus comprising:
  a receiver device configured to receive the semiconductor wafer, the semiconductor wafer (200) comprising: a semiconductor body; an insulation layer on the semiconductor body; a plurality of active regions each having a respective power semiconductor die and each forming a part of the semiconductor body; at least one scribeline region arranged adjacent to the active regions; a passivation structure arranged above the insulation layer and exposing a section of the insulation layer, the exposed section of the insulation layer being terminated by a termination edge of the passivation structure; and at least one optically detectable reference feature, wherein the at least one optically detectable reference features are included in one or more of the active regions, spatially displaced from the termination edge, and exposed by the passivation structure;
  a detector configured to acquire position data indicative of a position of the at least one optically detectable reference feature;
  a computing device configured to receive the position data and course data, the course data being associated with the semiconductor wafer and defining a course of the at least one scribeline region with respect to the position of the at least one optically detectable reference feature;
  a wafer separation device configured to separate the semiconductor wafer into the plurality of power semiconductor dies, wherein the computing device is configured to control the wafer separation device based on the position data and the course data.

* * * * *